(12) United States Patent
Aizawa

(10) Patent No.: US 6,337,586 B2
(45) Date of Patent: Jan. 8, 2002

(54) DIFFERENTIAL TRANSMISSION DRIVER CIRCUIT

(75) Inventor: Yukio Aizawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/801,062

(22) Filed: Mar. 8, 2001

(30) Foreign Application Priority Data

Mar. 9, 2000 (JP) ............................................ 12-065372

(51) Int. Cl.$^7$ ................................................ H03B 1/00
(52) U.S. Cl. ...................................... 327/108; 327/333
(58) Field of Search .............................. 327/108, 109, 327/112, 309, 310, 321, 333, 427, 431, 478, 482; 326/68, 75

(56) References Cited

U.S. PATENT DOCUMENTS

| | | | | |
|---|---|---|---|---|
| 5,654,655 A | * | 8/1997 | Awaji et al. ................. | 327/108 |
| 5,955,908 A | * | 9/1999 | Tam ........................... | 327/315 |
| 6,166,570 A | * | 12/2000 | Hedberg ..................... | 327/112 |
| 6,184,728 B1 | * | 2/2001 | Ohki .......................... | 327/108 |

FOREIGN PATENT DOCUMENTS

| | | |
|---|---|---|
| JP | 9-74340 | 3/1997 |
| JP | 9-214314 | 8/1997 |
| JP | 11-85343 | 3/1999 |
| JP | 11-205118 | 7/1999 |

* cited by examiner

Primary Examiner—My-Trang Nu Ton
(74) Attorney, Agent, or Firm—McGinn & Gibb, PLLC

(57) ABSTRACT

A driver circuit is provided, which has output characteristics capable of satisfying the DC and AC LVDS standards even if the power source and temperature fluctuate, has LVDS output characteristics, can reduce the number of outside components, and allows a dense package mounting. This driver circuit is constituted by connecting four NPN bipolar-type transistors and three resistors; four input signals are respectively input into base portions of these four NPN bipolar-type transistors; the first input signal and the second input signal have the same DC and AC levels but their phases are reversed, the third input signal and the fourth input signal have the same DC and AC levels but their phases are reversed; and the first input signal and the fourth input signal have the same phase, and the second input signal and the third input signal have the same phase.

10 Claims, 6 Drawing Sheets

DIFFERENTIAL TRANSMISSION DRIVER CIRCUIT

BACKGROUND OF THE INVENTION

1. Field of the Invention

The present invention relates to a driver circuit, which conducts differential transmission of differential signals in positive and negative phases.

2. Background Art

LVDS (Low Voltage Differential Signals) is a standard of an interface for high speed transmission of small amplitude signals which are now under standardization by the IEEE. This standard specifies a same DC potential level or AC amplitude level on the assumption that the device can be provided using a CMOS device.

In an LSI (Large Scale Integration) device, which conducts superhigh speed transmissions such as optical transmissions, formation processes such as a Bip-type NPNPSI process or an FET-type PMOS process for forming transistors which use holes as a (major) carrier are not used, but rather, formation processes such as a Bip-type NPNSI process, an FET-type NMOS process, or an MESFET process for forming transistors which uses electrons as carriers are adopted.

However, an interfaces such as an LVDS interface, which is realized by the use of the above-described conventional NPNSI process for high speed transmission is deemed to be an LVDS interface for convenience which can be used at the same current consumption, and the same DC potential and AC amplitude level are just satisfied for practical purposes.

FIG. 9 is a circuit diagram showing the conventional differential transmission river circuit, which is constituted by the Bip-type NPNSI process capable of providing the LVDS interface. As shown in FIG. 9, the differential transmission driver circuit comprises a driver circuit 10, a pair of transmission lines 1 and 2, and a terminal circuit 20. Transistors Q1 to Q6 constituting the driver circuit 10 are Bip-type NPN transistors.

The driver circuit 10 is comprised of a differential circuit 11 and an emitter follower circuit 12. The differential circuit 11 is a circuit for reversion amplification of the input signal VIN+ and VIN−, and the differential circuit 11 comprises four transistors Q1 to Q4 and three resistors R1 to R3. The emitter portions of a pair of transistors Q3 and Q4 are connected to each other, the base portions of these transistors Q3 and Q4 are connected to two input terminals respectively, and collector portions are connected with the resistor R2 and R3 respectively. The two output terminals of the differential circuit 11 are derived respectively from connection points a and b connecting the pair of collector portions of transistors Q3 and Q4 and resistors R2 and R3, respectively.

The transistors Q1 and the resistor R1 operate as a constant current circuit In the transistor Q1, the collector portion is connected to the power source voltage VCC through the resistor R1, the emitter portion is grounded, and the base portion is connected to the base portion of the transistor Q2. The base portion and the collector portion of the transistor Q1 are also connected (short-circuited). In the transistor Q2, the collector portion is connected to a connection point of emitter portions of the pair of transistors Q3 and Q4.

The emitter follower circuit 12 operates as a buffer for driving a load, and the emitter follower circuit 12 outputs two differential signals to the pair of transmission lines 1 and 2.

This emitter follower circuit 12 comprises two transistors Q5 and Q6. In these transistors Q5 and Q6, the base portions are respectively connected to collector portions of Q3 and Q4, the collector portions are connected to the power source voltage VCC, and the emitter portions are connected to the pair of transmission lines 1 and 2.

The receiver circuit 20 comprises a Thevenin termination circuit 21 and a termination resistor R0. The Thevenin termination circuit 21 executes Thevenin termination of differential signals transmitted through the pair of transmission lines 1 and 2, and also executes level shifting of the DC levels of the pair of the transmission line pair 1 and 2. The Thevenin termination circuit 21 is constituted by connecting serially connected resistors RT1, RT3, and RT5 and serially connected resistors RT2, RT4, and RT6 in parallel between the power source voltage VCC and the ground potential. The transmission line 1 is connected to a connection point between the two resistors RT1 and RT3, and the transmission line 2 is connected to a connection point between two resistors RT2 and RT4. The termination resistor R0 has a resistance of 100 Ω and is connected to a connection point c between resistors RT3 and RT5, and a connection point d between the resistors RT4 and RT6.

Next, an operation is described below.

The input signals VIN+ and VIN− are input from two input terminals into the transistors Q3 and Q4 in the differential circuit 11. In the differential circuit 11, the transistors Q3 and Q4 are turned on or off by the reverse action in response to the input levels of input signals VIN+ and VIN−, a constant current (current flowing in the transistor Q2) supplied from the constant current source circuit flows through the resistors R2 or R3, and a voltage drop is generated across R2 or in R3. The differential circuit 11 outputs the voltage drop across the resistor R2 or the resistor R3 as differential signals having positive or negative phases from the output terminal to the emitter signals having positive or negative phases from the output terminal to the emitter follower circuit 12.

The emitter follower circuit 12 transmits the differential signals having the positive and negative phases to the receiver circuit 20 through the pair of transmission lines 1 and 2. The emitter follower circuit 12 operates as a buffer.

Here, in the LVDS standard, the signal level of the differential output at the driver side is defined as 1.0 to 1.4 volts with reference to the ground potential (DC level) of the driver circuit 10 of 1.2 volts. That is, the LVDS interface standard defines that the direct current level (DC level) of the differential signal is 1.2 V, and the alternative current amplitude level (AC amplitude level) is 0.4 volts at maximum.

Accordingly, the values of the resistors R2 and R3 and the transistor Q2 of the differential circuit are set at specified values such that the AC amplitude level of the driver circuit 10 defined by the LVDS interface standard will be 0.4 V at maximum. (Since the AC amplitude level is determined by the voltage drop generated by the constant current supplied from the constant current source circuit while flowing through the resistors R2 and R3, the AC amplitude level can be set by changing the resistances of the resistors R2 and R3 and by changing the current value of the constant current supplied by the constant current source circuit).

The resistances of the resistors RT3 and RT4 in the Thevenin termination circuit 21 are set at specified values such that the DC level is defined by the LVDS interface standard. That is, the signal level of the differential output at the driver side corresponds to the potential across the connection points c and d of the Thevenin termination circuit in the receiver circuit 20 (that is, this potential is determined by the voltage drop from the direct current voltage VCC caused by the resistor R2 and R3, by the Vbe (0.8 V) corresponding to the voltage drop across the transistors Q5 and Q6 in the emitter follower circuit 12, and by the voltage drop caused by the resistors RT3 and RT4 in the Thevenin termination circuit 21). Accordingly, it is possible to execute level shifting such that the potentials across the connection points c and d of the Thevenin termination circuit 21 is determined to be 1.2 V by setting the resistors RT3 and RT4 to specified values in order to change the voltage drop values of the resistors RT3 and RT4.

As described above, the differential circuit 11 of the driver circuit 10 and the emitter follower circuit 12 constitutes a PECL (Pseudo Emitter Coupled Logic) circuit whose DC level is subjected to a level shift by applying a positive potential as the power source voltage VCC. The PECL circuit is a circuit in which the DC level of an ECL (Emitter Coupled Logic) circuit is shifted to the positive potential side, in contrast to the ECL circuit whose DC level is in the negative potential side.

A sink current (driving current) from the Thevenin termination circuit 10 flows through the transmission lines 1 and 2. This current is at a level of 35 mA to 40 mA.

The Thevenin termination circuit 21 of the receiver circuit 20 executes impedance matching such that the differential signal transmitted through transmission lines 1 and 2 is not reflected by the receiver circuit 20. When the characteristic impedance of transmission lines 1 and 2 is 50 Ω, the resistance values are determined such that the resistance of the resistors TRI, RT3, and RT5 in the Thevenin termination circuit 21 is set to 50 Ω (combined resistance of the parallel connection of the resistors RT1, RT3, and RT5 is 50 Ω), and the resistance value of RT2, RT4, and RT6 are set to 50 Ω (combined resistance of the parallel connection of the resistors RT2, RT4, and RT6 is 50 Ω). The output signal generates a desired signal voltage, after its level is shifted in the Thevenin termination circuit 21.

However, when the above-described conventional driver circuit 10 is used, it is necessary to supply a sink current (driving current) in a level of 35 mA to 40 mA to transmission lines 1 and 2, and it is necessary to supply the same current to transmission lines 1 and 2 even when the driver circuit 10 is stopped, which causes a problem in that the current consumption increases.

In addition, it is necessary for the conventional driver circuit 10 to provide resistors RT1 to RT6 in the Thevenin termination circuit 21 in order to carry out impedance matching and the level shift of the DC level, which causes a problem in that the cost for the parts increases, and the resultant driver circuit becomes unsuitable for mounting.

SUMMARY OF THE INVENTION

The present invention is made to solve the above-described problems and the object of the present invention is to provide a driver circuit capable of suppressing the amount of power consumption, reducing the cost of parts, and which has a closed-packed mounting.

According to the first embodiment, the driver circuit comprises a first NPN bipolar-type transistor whose collector portion is connected to a positive power source, a second NPN bipolar-type transistor whose collector portion is connected to the positive power source, a third NPN bipolar-type transistor whose collector portion is connected to a first signal output terminal; a fourth NPN bipolar-type transistor whose collector portion is connected to a second signal output terminal; a first resistor, one end of which is connected to the emitter portion of said first NPN bipolar-type transistor, and the other end of which is connected to the collector portion of said third NPN bipolar-type transistor; a second resistor, one end of which is connected to the emitter portion of said second NPN bipolar-type transistor, and the other end of which is connected to the collector portion of said fourth NPN bipolar-type transistor; and a third resistor, one end of which is connected to the respective emitter portions of said third and fourth NPN bipolar-type transistors, and the other end of which is connected to the ground potential; wherein a first input signal is input into the base portion of said first NPN bipolar-type transistor, a second input signal is input into the base portion of said second NPN bipolar-type transistor, a third input signal is input into the base portion of said third NPN bipolar-type transistor; and a fourth input signal is input into the base portion of said fourth NPN bipolar-type transistor, said first input signal and said second input signal have the same DC and AC levels but their phases are reversed, said third input signal and said fourth input signal have the same DC and AC levels but their phases are reversed, said first input signal and said fourth signal have the same phase, and said second input signal and said third input signal have the same phase.

According to the second aspect, in the above driver circuit, the resistance values of the first and second resistors are set such that the total resistance of the first resistor and the emitter portion resistance of said first NPN bipolar-type transistor are set to 50 Ω, and the total resistance of the second resistor and the emitter portion resistance of said second NPN bipolar-type transistor is set to 50 Ω.

According to the third aspect, in the above driver circuit, after said first input signal, said second input signal, said third input signal, and said fourth input signals are respectively input, and while an AC operation is carried out for outputting differential signals from said first and said second signal output terminals, the DC voltage level and the AC voltage levels of said first and second input signals are set such that a first current which is determined by the voltage of said third input signal and the voltage of said fourth input signal and the third resistor, a second current flowing between said first signal output terminal and said second signal output terminal, and third currents respectively flowing in the first resistor and the second resistor become the same.

According to the fourth aspect, in the above driver circuit further comprising a fifth NPN bipolar-type transistor whose collector portion is connected to the positive power source, a sixth NPN bipolar-type transistor whose collector portion is connected to the positive power source, a fourth resistor, one end of which is connected to the emitter portion of said fifth NPN bipolar-type transistor, a fifth resistor, one end of which is connected to the emitter portion of said sixth NPN bipolar-type transistor, a seventh bipolar-type transistor whose collector portion is connected to the other end of the fourth resistor, whose emitter portion is connected to the ground potential, and whose base portion is connected to the reference current source, and an eighth NPN bipolar-type transistor whose collector portion is connected to the other end of the fifth resistor and to the base portion of said fourth NPN bipolar-type transistor, whose emitter portion is connected to the ground potential, and whose base portion is connected to the reference current source, a sixth input signal is input into the base portion of said sixth NPN bipolar-type transistor, said first input signal has the same phase as that of said sixth input signal, and said second input signal has the same phase as that of said fifth input signal.

According to the fifth aspect, the above driver circuit further comprises a first capacitance provided in parallel with the fourth resistor and a second capacitance provided in parallel with the fifth resistor.

According to the sixth aspect, the above driver circuit further comprises: a sixth resistor, one end of which is connected to the positive power source; a seventh resistor, one end of which is connected to another end of the sixth resistor, and the other end of which is connected to the base portion of said fifth NPN bipolar-type transistor; an eighth resistor, one end of which is connected to the other end of the sixth resistor, and the other end of which is connected to the base portion of said sixth NPN bipolar-type transistor; a ninth resistor, one end of which is connected to the other end of said seventh resistor; a tenth resistor, one end of which is connected to the other end of the eighth resistor; a ninth NPN bipolar-type transistor, in which the collector portion is connected to another end of said ninth resistor, and to whose base portion a seventh input signal is input, a tenth NPN bipolar-type transistor, in which the collector portion is connected to the other end of the tenth resistor, and the base portion a seventh input signal is input, and an eleventh NPN bipolar-type transistor, whose collector portion is connected to both emitters of said ninth NPN bipolar-type transistor and said tenth NPN bipolar-type transistor, whose base portion is connected to a first reference current source, and whose emitter portion is connected to the ground potential.

According to the seventh aspect, the above driver circuit further comprises a twelfth NPN bipolar-type transistor, whose collector portion is connected to the other end of the sixth resistor, whose base portion is connected to the first reference current source, and whose emitter portion is connected to the ground potential.

According to the eighth aspect, the driver circuit further comprises: an eleventh resistor, one end of which is connected to the positive power source; a thirteenth NPN bipolar-type transistor, whose collector portion and whose base portion are connected to said eleventh resistor; a fourteenth NPN bipolar-type transistor, whose collector portion is connected to the collector portion and the base portion of said thirteenth NPN bipolar-type transistor, whose base portion is connected to the emitter portion of said thirteenth NPN bipolar-type transistor, and whose emitter portion is connected to the ground potential; and an output portion comprised of a first reference current source that corresponds to the base portion of said fourteenth NPN bipolar-type transistor.

According to the ninth aspect, in the above driver circuit, said fifth input signal is input in place of said first input signal into the base portion of said first NPN bipolar-type transistor and said sixth input signal is input in place of said second input signal into the base portion of the second NPN bipolar-type transistor.

According to the tenth aspect, in the above driver circuit, NMOS transistors or NchFET transistors are used in place of the NPN bipolar-type transistors.

The driver circuit of the present invention exhibits an advantageous effect in that the present driver circuit is capable of satisfying the DC and AC LVDS standards even if the power source and temperature fluctuate, has LVDS output characteristics, can reduce the number of outside components, and allows a dense package mounting.

DETAILED DESCRIPTION OF THE INVENTION

Hereinafter, three embodiments of the present invention are described.

[First Embodiment]

Figure 1:
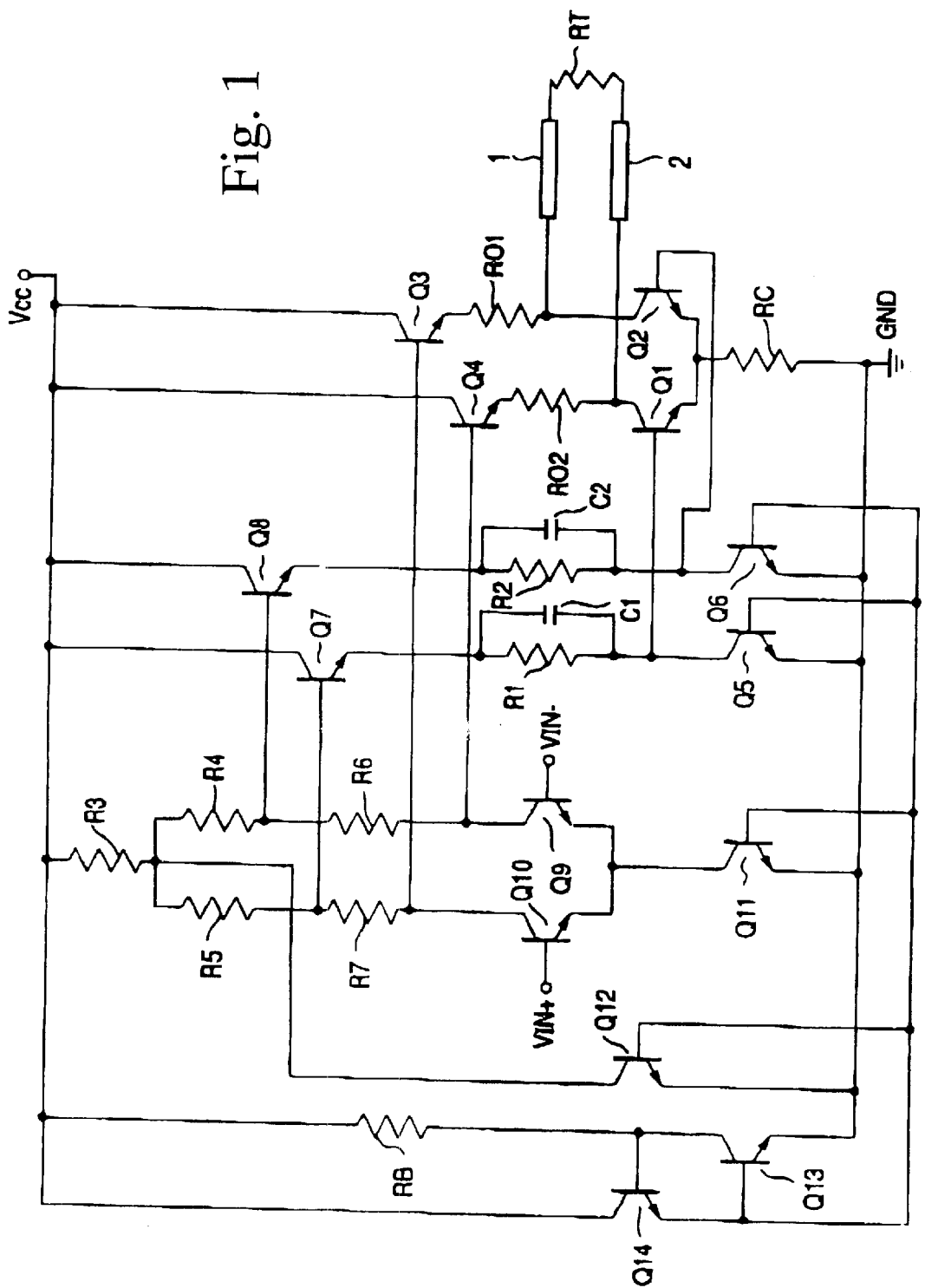
FIG. 1 is a circuit diagram showing the structure of the differential transmission circuit.
Figure 2:
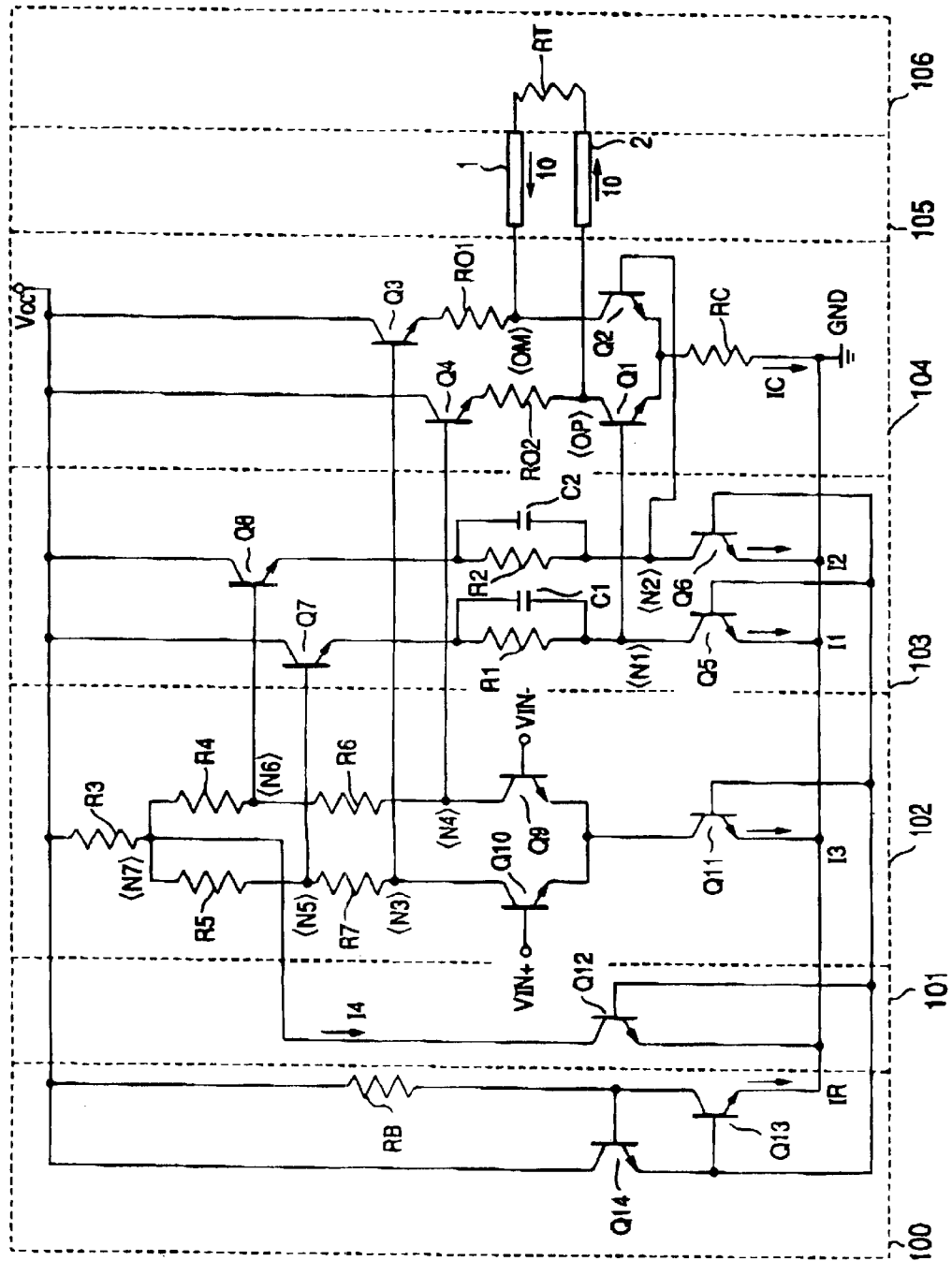
FIG. 2 is a circuit diagram explaining FIG. 1.

FIG. 1 is a circuit diagram showing the structure of the differential transmission circuit. FIG. 2 is a circuit diagram explaining FIG. 1.

As shown in FIG. 2, the driving circuit according to the present invention comprises various circuits such as a reference power source 100, a level adjuster 101, a differential circuit 102, a level shift circuit 103, and an output stage 104, and the output portion is terminated at a termination resistor 106 through a transmission line 105.

The reference power source 100 is used for the reference power of the differential circuit 102, the level shift circuit 103, and the level adjuster 101; the reference power source 100 suppresses fluctuation of the output voltage of the driver circuit when the output voltage fluctuates due to variations in the power source or ambient temperature.

The differential circuit 102, the level shift circuit 103, and the output stage 104 outputs a signal at a LVDS level in response to the input signals VIN+ and VIN−.

The output resistances of the driver circuit are respectively set by the output resistances of the transistor Q3+ and the resistor RO1, and the output resistances of the transistor Q4 and the resistor RO2.

That is, the characteristic impedance of transmission lines and the termination resistance (100 Ω) are matched by setting the output resistances of the output portions of the driver circuit to a prescribed value (50 Ω).

The operation of the driving circuit is described below.

The operation is described by dividing it into two parts regarding DC characteristics and AC characteristics.

(1) DC Characteristics

To simplify the description, it is assumed that each voltage between the base portion and the emitter portions for all transistors are defined as Vbe, and the input signals VIN+ and VIN− are balanced.

Figure 3:
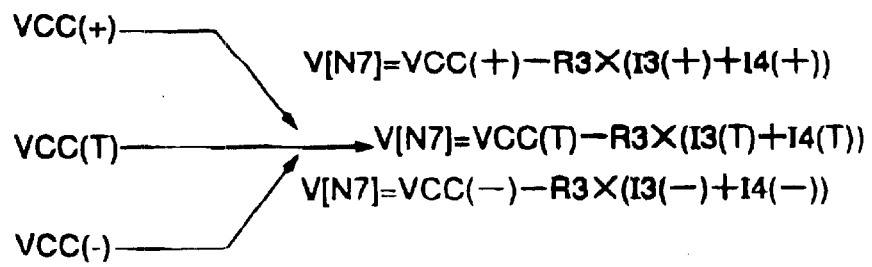
FIG. 3 is a diagram showing the potential state at node N7.

As shown in FIG. 3, the node potential at node N7 is maintained constant by changing I3 and I4 when there is a change of the power source voltage. In FIG. 3, it is noted that V(+) represents a positive (+) change in VCC, V(T) represents no change in VCC, and V(−) represents a negative (−) change in VCC; I3(+) and I4(+) represent the currents respectively flowing through transistors Q11 and Q13 during a positive change in VCC, and I3(−) and I4 (−) represent the currents respectively flowing through transistors Q11 and Q13 during a negative change in VCC.

Each node potential for each V(node) can be expressed as follows.

$$V(N7)=VCC-R3\times(I3+I4) \quad (1)$$

$$V(N5)=V(N7)-R5\times I3 \quad (2)$$

$$V(N3)=V(N7)-(R5+R7)\times I3 \quad (3)$$

$$V(N1)=V(N5)-Vbe-R1\times I1 \quad (4)$$

Here, since $IC=\{V(N1)-Vbe-0(GND)\}/RC \quad (5)$ then, $$V(OM)=V(N3)-Vbe-RO1\times IC/2 \quad (6)$$

As shown above, each constant is adjusted so as to conform with LVDS at the DC level and is set so that V(OM)=1.2 V.

In addition, as shown by Equations (3) and (5), although the IC has a temperature characteristics of 2×Vbe, the temperature characteristics can be suppressed by use of the reference power source 100, and the temperature fluctuation of the AC level can also be also suppressed.

(2) AC Characteristics

Figure 4:
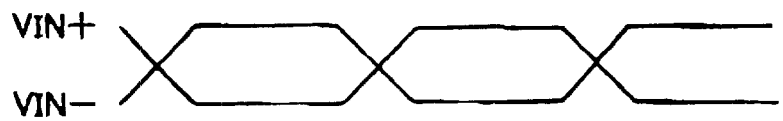
FIG. 4 is a timing chart showing an example of AC voltage signals input into the input portion of the differential circuit.
Figure 5:
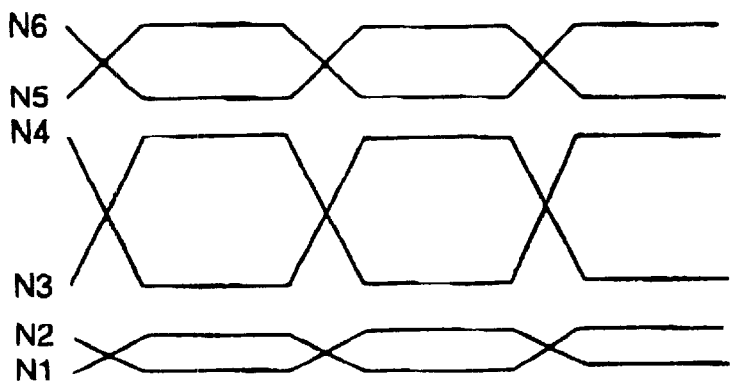
FIG. 5 is a diagram explaining the changing states of respective node voltages at N1 to N6.
Figure 6:
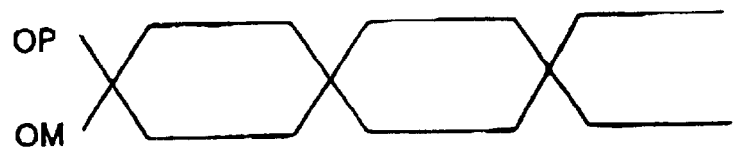
FIG. 6 is a diagram explaining the states of the signals, output from OP and OM when the signals are input as shown in FIG. 5.

When a voltage signal is input into the input portion of the differential circuit 102 shown in FIG. 4, each node voltage changes as shown in FIG. 5, and each voltage signal is output as shown in FIG. 6. That is, when H and L are input respectively into VIN+ and VIN−, then H is input into Q2 and Q4 at the output stage 104, and L is input into Q1 and Q3, at a time t, yielding:

$$V(OP,t)=V(N4,t)-Vbe-RO2\times IC' \quad (7)$$

$$V(OM,t)=V(N3,t)-Vbe-RO1\times IC'' \quad (8)$$

where, IC'+IC''=IC

Here, each constant is adjusted so as to conform with the AC level of LVDS yielding: V(OP,t)−V(OM,t)≦0.4 V.

Furthermore, when the level is adjusted so as to satisfy the following equation, V(OM,t)≈V(N3,t), then IC'' becomes zero, so that, from Kirchhoff's law, $$IC'=IC=IO \quad (9)$$

and the current flowing in the output stage becomes the same as that flowing in the termination resistor. Accordingly, low current consumption is realized.

The capacitances C1 and C2 act as speed-up capacitances.

The driver circuit shown in FIG. 8, which will be described later, has the same operation except that the conversion of AC and DC levels is executed by the connection of resistors.

As described above, according to this embodiment, the current flowing through the termination resistor RT becomes the same as that flowing through the output stage 105, and the present driver circuit does not require a sink current; therefore the current required for driving the present driver circuit can be reduced to one-tenth of the current required for the conventional driver circuit which requires 35 mA to 40 mA as the sink current.

Since the present invention provides a driver circuit capable of internally executing impedance matching and setting the ground potential (DC level) of the LVDS interface standard, the present driver circuit does not requires outside resistors RT1 to RT6 for the Thevenin termination circuit which are needed for the conventional driver circuit; thus results in not only reducing cost of parts, but enables the realization of a dense package mounting.

[Second Embodiment]

Figure 7:
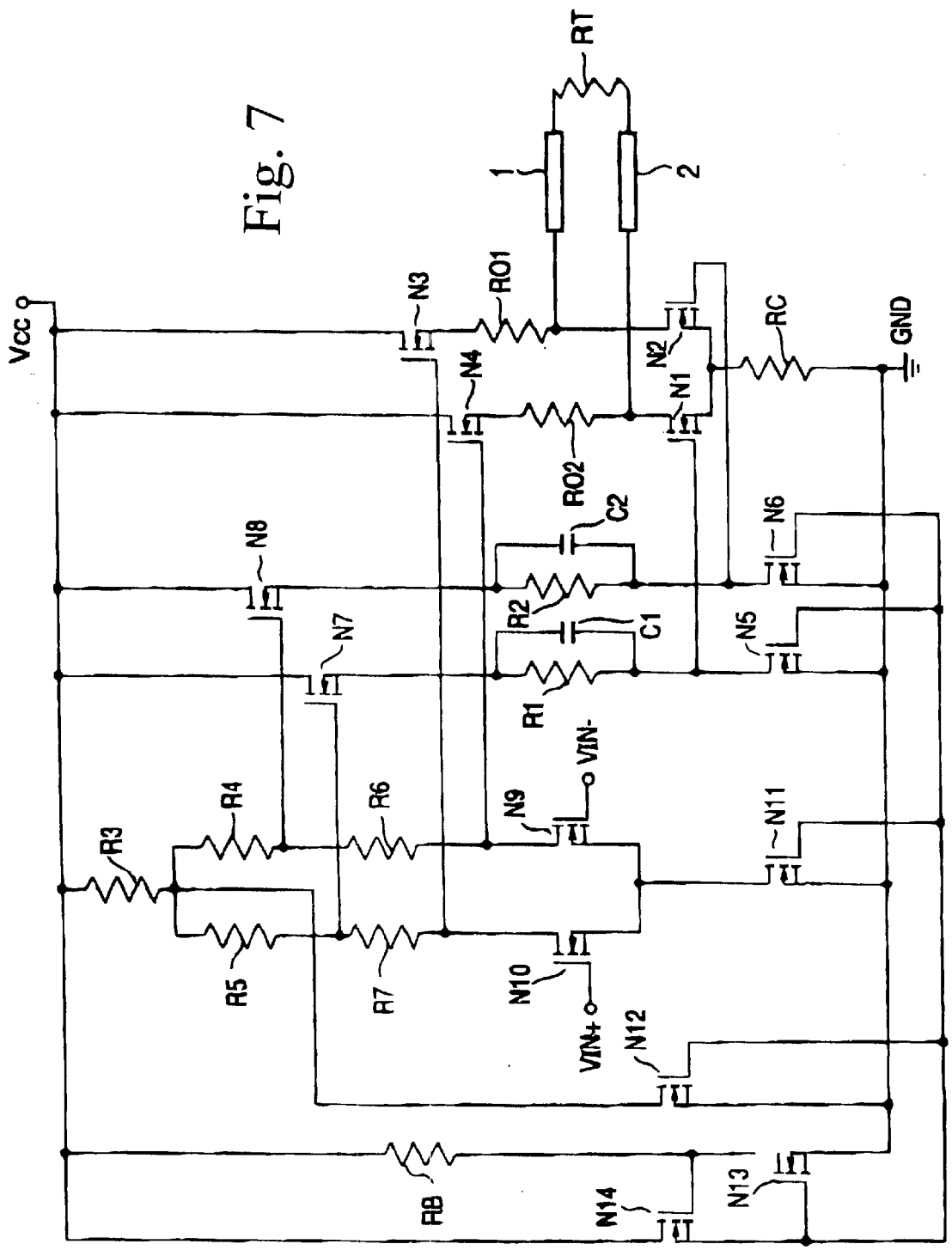
FIG. 7 is a circuit diagram showing the structure of the differential transmission circuit according to the second embodiment of the present invention.

FIG. 7 is a circuit diagram showing the structure of the differential transmission circuit according to the second embodiment of the present invention. This circuit has NMOS transistors N1 to N14 in place of the Bip-type NPN transistors shown in FIG. 1, and the threshold voltage Vt corresponds to Vbe. It is noted that the compound NPN bipolar type transistors can be replaced with NchFET-type transistors.

[Third Embodiment]

Figure 8:
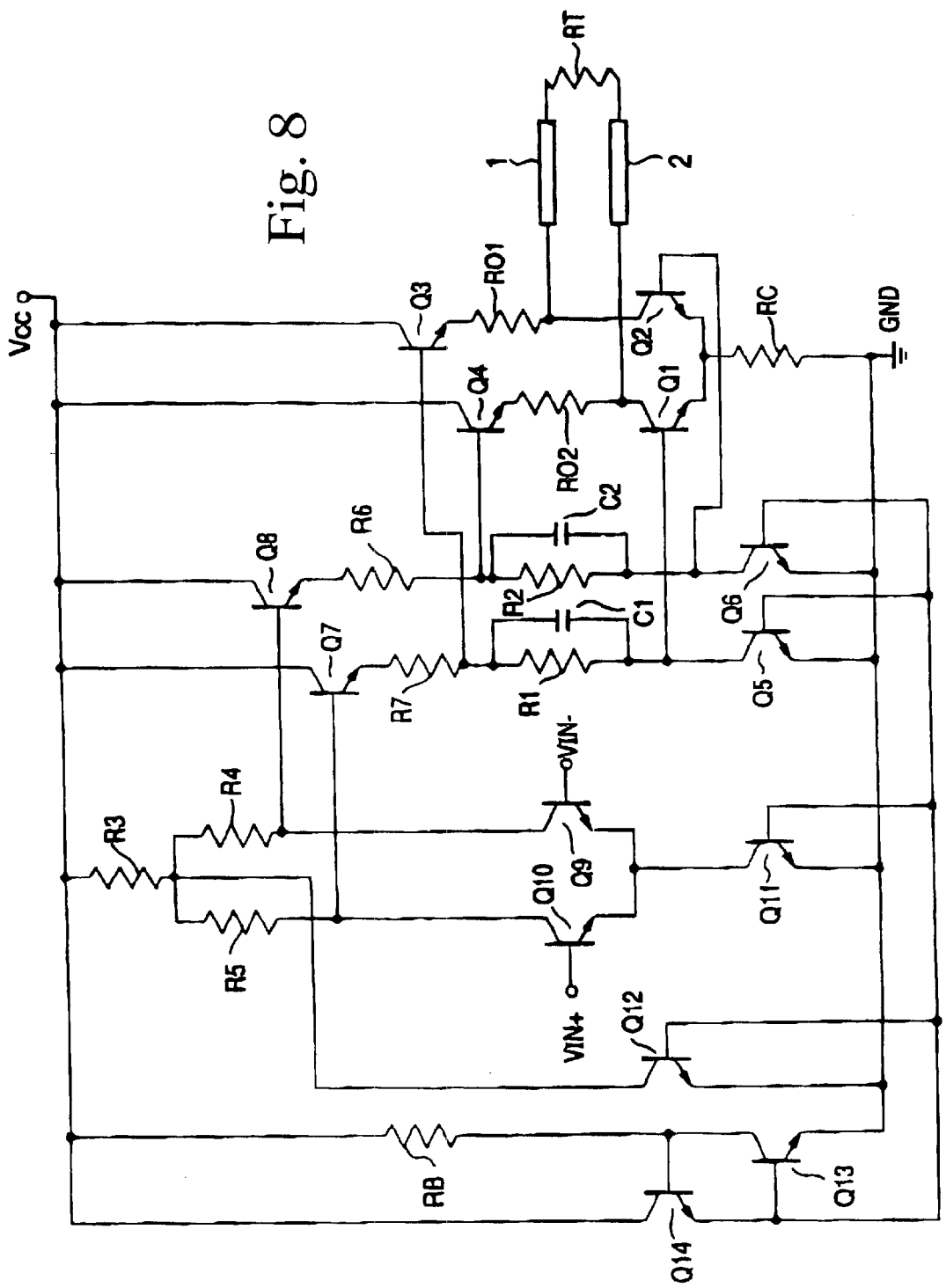
FIG. 8 is a circuit diagram showing the structure of the differential transmission circuit according to the third embodiment of the present invention.
Figure 9:
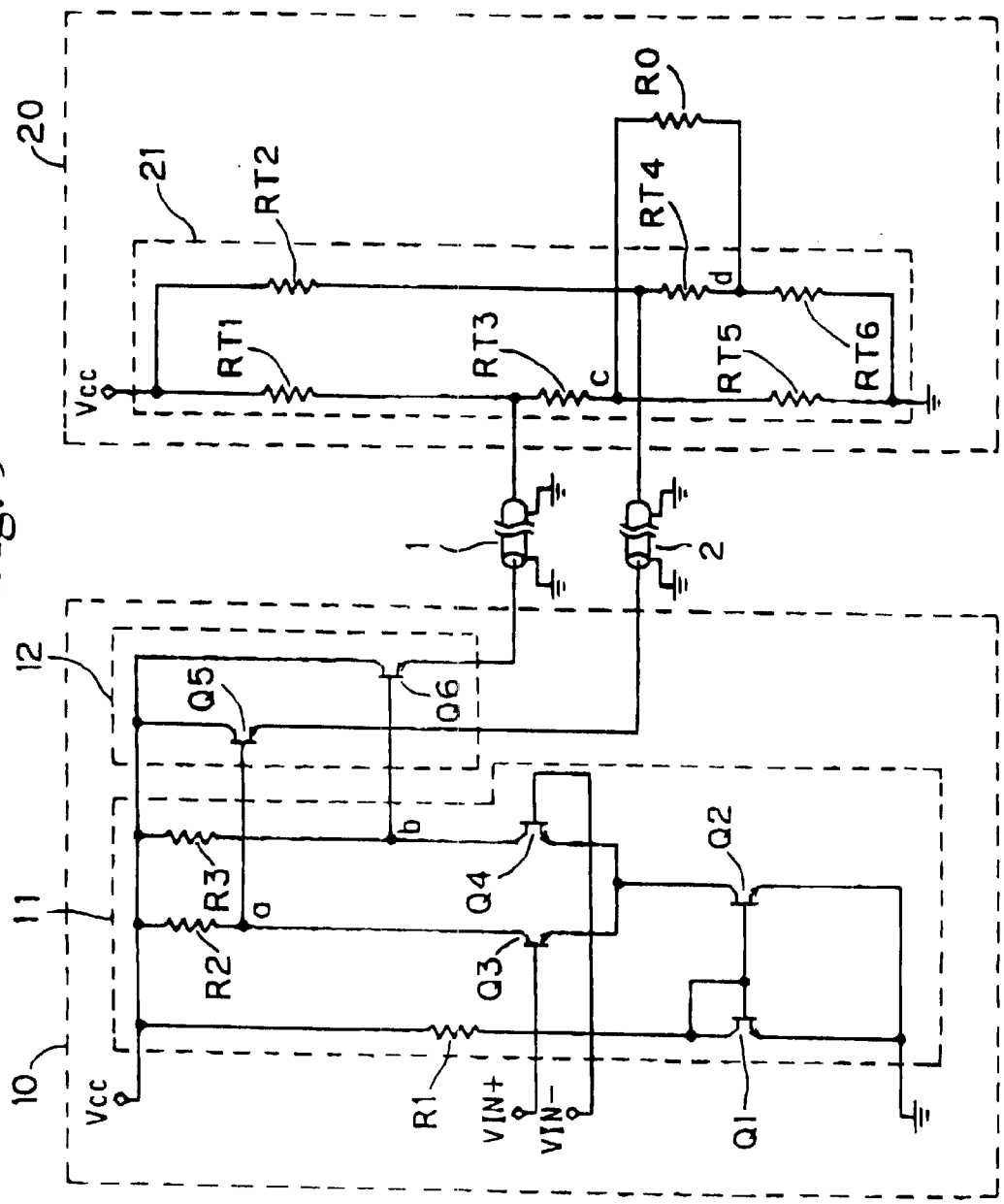
FIG. 9 is a circuit diagram showing the structure of a conventional differential transmission circuit.

FIG. 8 is a circuit diagram showing the structure of a differential transmission circuit according to the third embodiment of the present invention. In this circuit, the method of level shifting by the resistors is changed.

What is claimed is:

1. A driver circuit comprising:
    a first NPN bipolar-type transistor whose collector portion is connected to a positive power source;
    a second NPN bipolar-type transistor whose collector portion is connected to the positive power source;
    a third NPN bipolar-type transistor whose collector portion is connected to a first signal output terminal;
    a fourth NPN bipolar-type transistor whose collector portion is connected to a second signal output terminal;
    a first resistor, one end of which is connected to the emitter portion of said first NPN bipolar-type transistor, and the other end of which is connected to the collector portion of said third NPN bipolar-type transistor;
    a second resistor, one end of which is connected to the emitter portion of said second NPN bipolar-type transistor, and the other end of which is connected to the collector portion of said fourth NPN bipolar-type transistor; and
    a third resistor, one end of which is connected to respective emitter portions of said third and fourth NPN bipolar-type transistors, and the other end of which is connected to the ground potential; wherein
    a first input signal is input into the base portion of said first NPN bipolar transistor;
    a second input signal is input into the base portion of said second NPN bipolar transistor;
    a third input signal is input into the base portion of said third NPN bipolar transistor; and
    a fourth input signal is input into the base portion of said fourth NPN bipolar transistor; wherein
    said first input signal and said second input signal have the same DC and AC levels but their phases are reversed;
    said third input signal and said fourth input signal have the same DC and AC levels but their phases are reversed; and
    said first input signal and said fourth signal have the same phase, and said second input signal and said third input signal have the same phase.

2. A driver circuit according to claim 1, wherein resistance values of the first and second resistors are set such that the total resistance of the first resistor and the emitter portion resistance of said first NPN bipolar-type transistor are set to 50 Ω, and the total resistance of the second resistor and the emitter portion resistance of said second NPN bipolar-type transistor are set to 50 Ω.

3. A driver circuit according to claim 1, wherein, after said first input signal, said second input signal, said third input signal, and said fourth input signals are respectively input, and while an AC operation is carried out for outputting differential signals from said first and said second signal output terminals, wherein the DC voltage level and the AC voltage level of said first and second input signals are set such that a first current which is determined by the voltage of said third input signal, the voltage of said fourth input signal and the third resistor, a second current flowing between said first signal output terminal and said second signal output terminal, and third currents respectively flowing in the first resistor and the second resistor become the same.

4. A driver circuit according to claim 1, wherein the driver circuit further comprises:

a fifth NPN bipolar-type transistor whose collector portion is connected to the positive power source;

a sixth NPN bipolar-type transistor whose collector portion is connected to the positive power source;

a fourth resistor, one end of which is connected to the emitter portion of said fifth NPN bipolar-type transistor;

a fifth resistor, one end of which is connected to the emitter portion of said sixth NPN bipolar-type transistor;

a seventh bipolar-type transistor, whose collector portion is connected to the other end of the fourth resistor, whose emitter portion is connected to the ground potential, and whose base portion is connected to a reference current source; and an eighth bipolar-type transistor, whose collector portion is connected to the other end of the fifth resistor and to the base portion of said fourth NPN bipolar-type transistor, whose emitter portion is connected to the ground potential, and whose base portion is connected to the reference current source; wherein a fifth input signal is input into the base portion of said fifth NPN bipolar-type transistor; and a sixth input signal is input into the base portion of said sixth NPN bipolar-type transistor, said first input signal has the same phase as that of said sixth input signal, and said second input signal has the same phase as that of said fifth input signal.

5. A driver circuit according to claim 1, wherein the driver circuit further comprises a first capacitance provided in parallel with the fourth resistor and a second capacitance provided in parallel with the fifth resistor.

6. A driver circuit according to claim 1, wherein the driver circuit further comprises:

a sixth resistor, one end of which is connected to the positive power source, a seventh resistor, one end of which is connected to the other end of the sixth resistor, and the other end of which is connected to the base portion of said fifth NPN bipolar-type transistor;

an eighth resistor, one end of which is connected to the other end of the sixth resistor, and the other end of which is connected to the base portion of said sixth NPN bipolar transistor;

a ninth resistor, one end of which is connected to the other end of said seventh resistor;

a tenth resistor, one end of which is connected to the other end of said eighth resistor;

a ninth NPN bipolar-type transistor, in which the collector portion is connected to the other end of said ninth resistor, and to whose base portion a seventh input signal is input;

a tenth NPN bipolar-type transistor, in which the collector portion is connected to the other end of said tenth resistor, and to whose base portion said seventh input signal is input; and an eleventh NPN bipolar-type transistor, in which the collector portion is connected to both emitters of said ninth NPN bipolar-type transistor and said tenth NPN bipolar-type transistor, whose base portion is connected to a first reference current source, and whose emitter portion is connected to the ground potential.

7. A driver circuit according to claim 1, wherein the driver circuit further comprises a twelfth NPN bipolar-type transistor, whose collector portion is connected to the other end of the sixth resistor, whose base portion is connected to a first reference current source, and whose emitter portion is connected to the ground potential.

8. A driver circuit according to claim 1, wherein the driver circuit further comprises:

an eleventh resistor, one end of which is connected to the positive power source;

a thirteenth NPN bipolar-type transistor, whose collector portion and whose base portion are connected to said eleventh resistor; and a fourteenth NPN bipolar-type transistor, whose collector portion is connected to the collector portion and the base portion of said thirteenth NPN bipolar-type transistor, whose base portion is connected to the emitter portion of said thirteenth NPN bipolar-type transistor, and whose emitter portion is connected to the ground potential;

wherein, an output portion is comprised of a first reference current source that corresponds to the base portion of said fourteenth NPN bipolar-type transistor.

9. A driver circuit according to claim 1, wherein said fifth input signal is input in place of said first input signal into the base portion of said first NPN bipolar-type transistor and said sixth input signal is input in place of said second input signal into the base portion of the second NPN bipolar-type transistor.

10. A driver circuit according to claim 1, wherein NMOS transistors or NchFET transistors are used in place of the NPN bipolar-type transistors.

* * * * *